United States Patent

Mori et al.

[11] Patent Number: 5,610,965
[45] Date of Patent: Mar. 11, 1997

[54] EXPOSURE METHOD

[75] Inventors: Makiko Mori, Atsugi; Kunitaka Ozawa, Isehara; Koji Uda, Yokohama; Isamu Shimoda, Zama; Shunichi Uzawa, Tokyo; Eiji Sakamoto, Sagamihara, all of Japan

[73] Assignee: Canon Kabushiki Kaisha, Tokyo, Japan

[21] Appl. No.: 197,569

[22] Filed: Feb. 17, 1994

Related U.S. Application Data

[63] Continuation of Ser. No. 946,788, Sep. 18, 1992, abandoned, which is a continuation of Ser. No. 676,469, Mar. 2, 1991, abandoned, which is a continuation of Ser. No. 405,187, Sep. 11, 1989, abandoned.

[30] Foreign Application Priority Data

Sep. 13, 1988  [JP]  Japan .................................. 63-22738

[51] Int. Cl.$^6$ ............................................. G21K 5/00
[52] U.S. Cl. .......................................... 378/34; 250/492.1
[58] Field of Search .................. 378/34, 35; 25/443.1, 25/492.1

[56] References Cited

U.S. PATENT DOCUMENTS

| | | | |
|---|---|---|---|
| 4,692,934 | 9/1987 | Forsyth | 378/34 |
| 4,825,453 | 4/1989 | Kembo et al. | 378/34 |
| 4,852,133 | 7/1989 | Ikeda et al. | 378/34 |
| 4,969,168 | 11/1990 | Sakamoto et al. | 378/34 |
| 5,171,965 | 12/1992 | Suzuki et al. | 219/121.6 |

FOREIGN PATENT DOCUMENTS 58-191433  11/1983  Japan ......................................... 378/34

*Primary Examiner*—Craig E. Church
*Attorney, Agent, or Firm*—Fitzpatrick, Cella, Harper & Scinto

[57] ABSTRACT

A method of exposing a wafer to exposure energy such as ultraviolet rays or X-rays through a mask to transfer a pattern of the mask onto the wafer, for example. The temperature of the mask and/or the wafer increases during the exposure operation by absorption of the exposure energy. While the wafer is being exposed, the temperature of the mask and/or the wafer is detected. If the temperature is going to exceed an exposable temperature range determined on the basis of the line width of the pattern to be transferred, the exposure operation is interrupted. Then, the heat accumulated in the mask and/or the wafer is removed. Thereafter, the exposure operation is resumed. This is repeated until the predetermined or required amount of exposure is reached, for one shot. By this, thermal expansion of the mask and the wafer during the exposure operation is prevented to assure the precision of the pattern transfer.

15 Claims, 6 Drawing Sheets

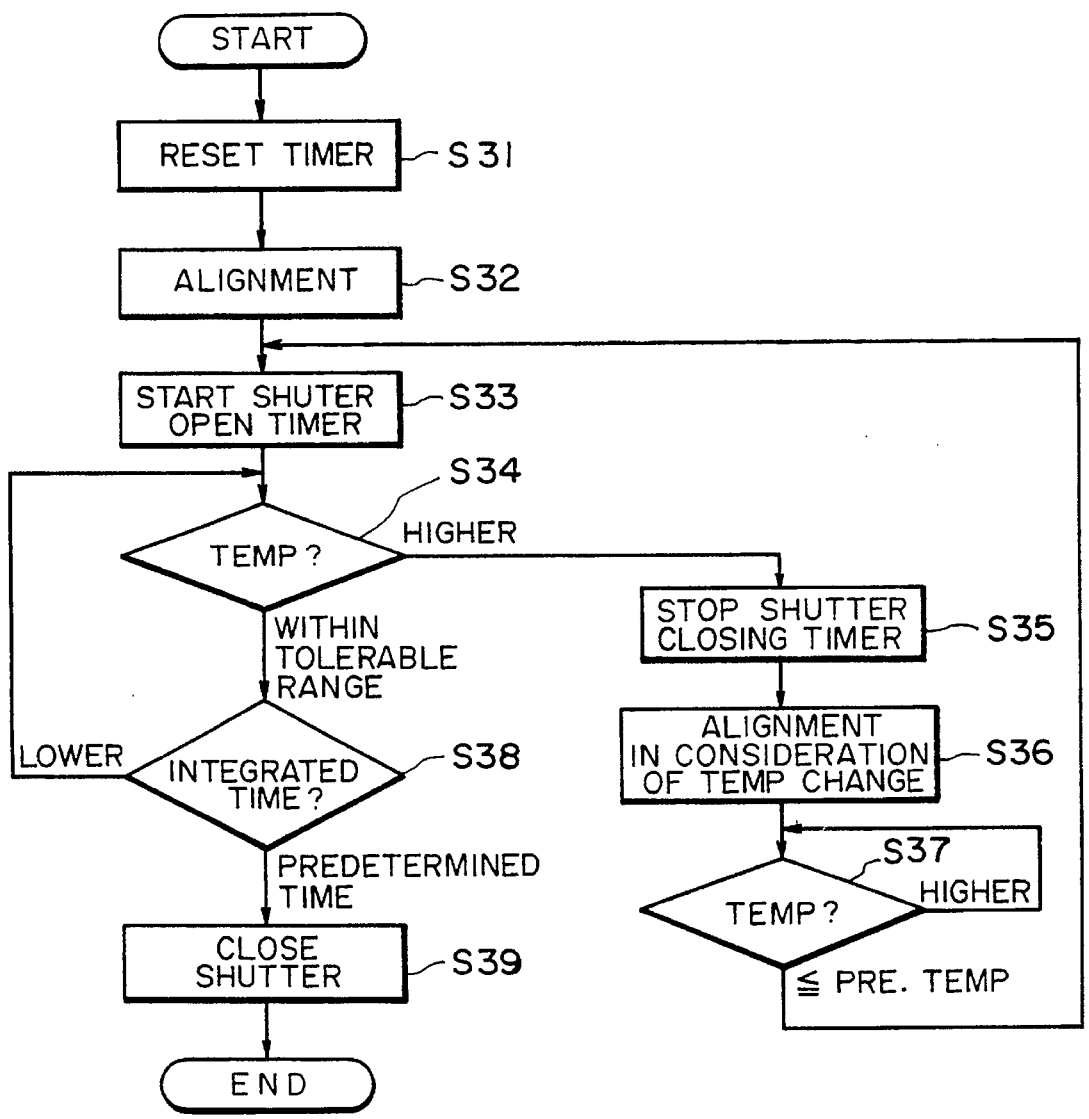
F I G. 4

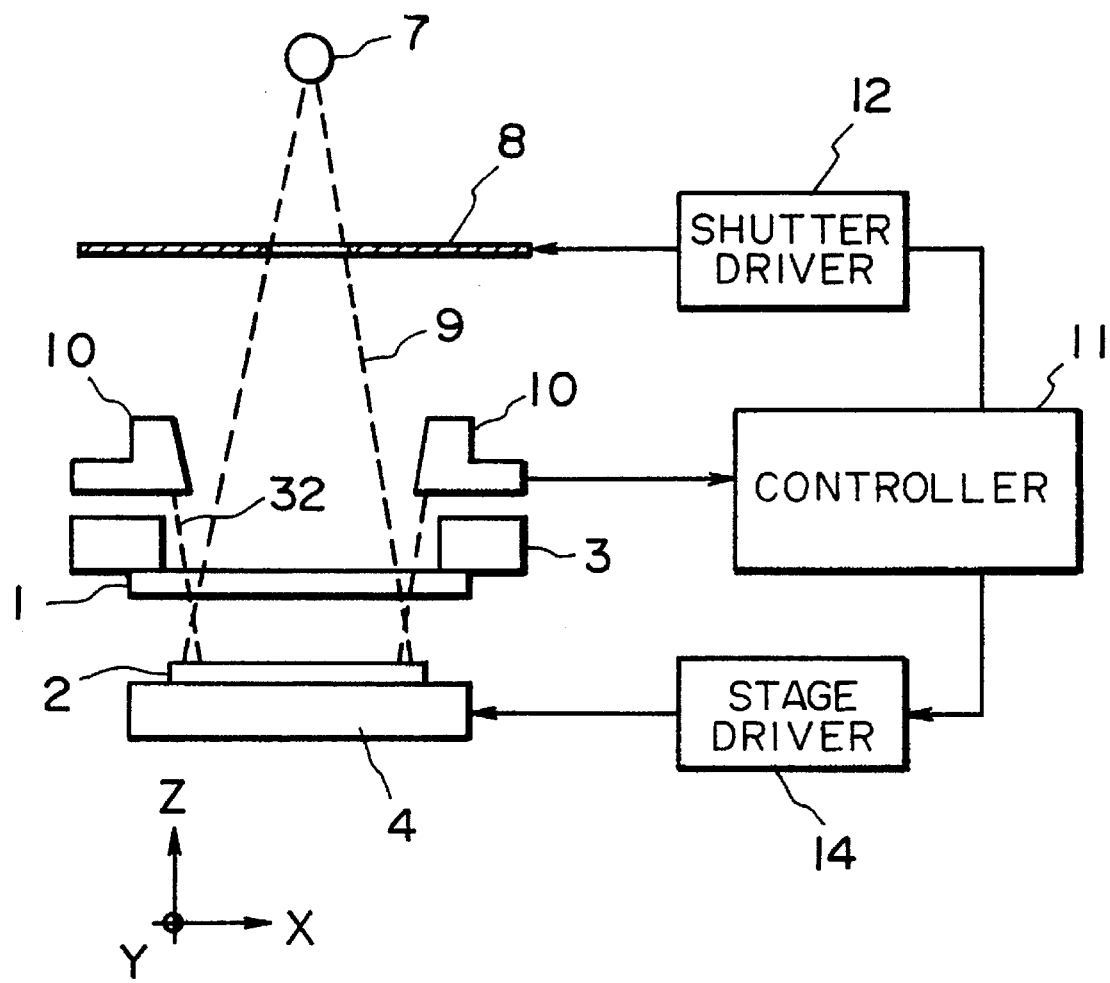
F I G. 5

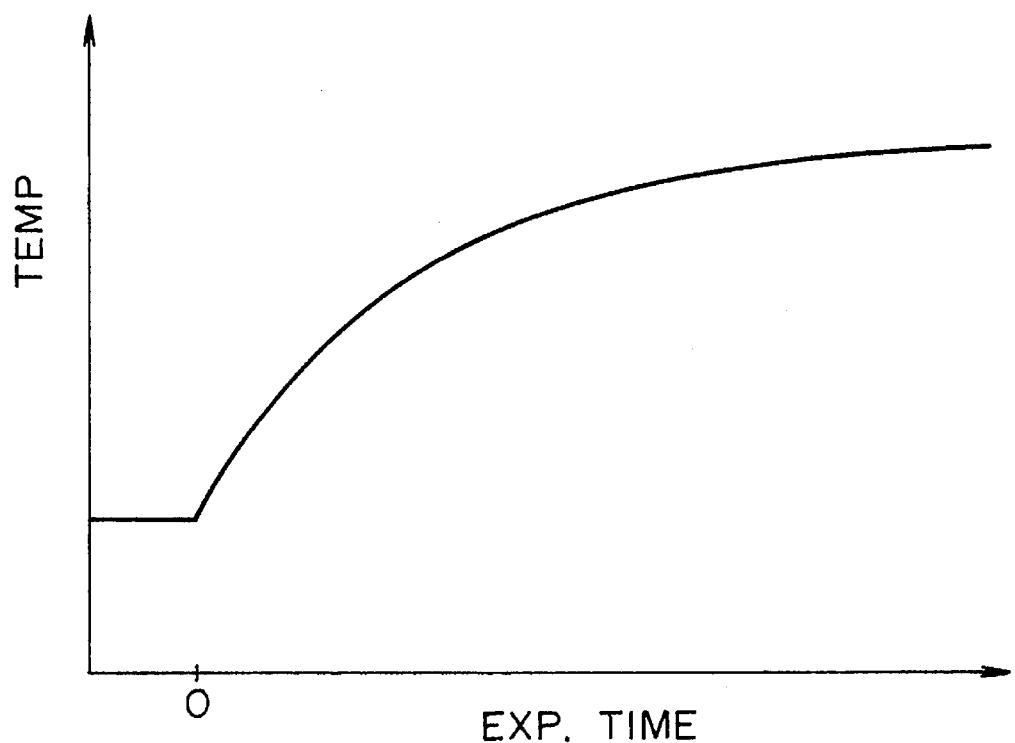
F I G. 6A
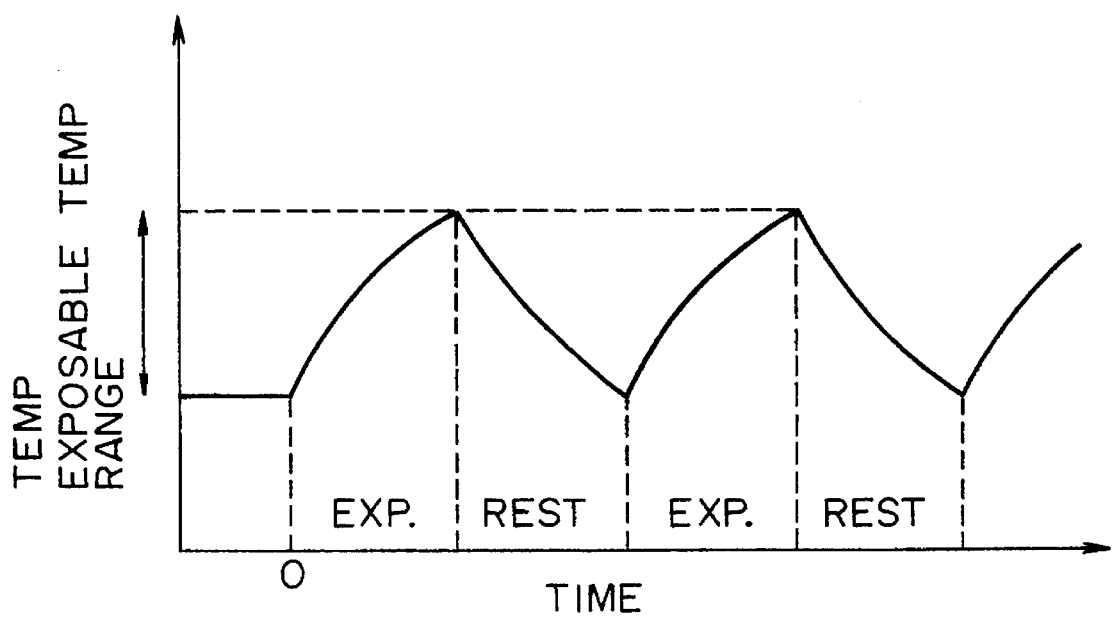
F I G. 6B

EXPOSURE METHOD

This application is a continuation of prior application Ser. No. 07/946,788 filed Sep. 18, 1992, which application is a continuation of prior application, Ser. No. 07/676,469 filed Mar. 27, 1991, which application is a continuation of prior application, Ser. No. 07/405,187 filed Sep. 11, 1989, all now abandoned.

FIELD OF THE INVENTION AND RELATED ART

The present invention relates to an exposure method, particularly to an exposure method for a semiconductor device particularly to an exposure method wherein a wafer is exposed to X-rays from an X-ray source through a mask having a pattern, by which the pattern is transferred or printed on the wafer.

Recently, density of patterns for semiconductor devices such as IC or LSI devices are increasing, and therefore, formation, on the semiconductor wafer, of an extremely fine pattern is desired in this field. In the exposure method for transferring the mask pattern onto the wafer, a shorter wavelength of the exposure energy (radiation) is desired to reduce the linewidth of the transferred pattern. To meet this, an exposure method using far ultraviolet rays or X-rays has already been proposed.

SUMMARY OF THE INVENTION

The short wavelength radiation such as X-rays has a certain energy, and that energy is absorbed and accumulated in the mask or the wafer with the result that the temperatures thereof are increased before the necessary quantity of exposure of the photoresist is applied on the wafer. The temperature rise deforms the mask or the wafer with the result of deterioration of the exposure accuracy.

Accordingly, it is a principal object of the present invention to provide an exposure method wherein the temperature rises of the mask and the wafer are suppressed, by which a highly accurate and fine exposure is possible while maintaining the proper temperatures thereof.

According to an aspect of the present invention, there is provided an exposure method for transferring a pattern of the mask onto the wafer, wherein during one shot exposure operation, a shutter for blocking the exposure energy is driven, or the exposure energy is turned on and off at such intervals that the temperatures of the mask and the wafer do not exceed an exposable temperature range defined depending on the line width of the pattern to be transferred or the like. The intervals are determined using a temperature monitoring system or using a predetermined relationship between the exposure period and the temperature change. In this manner, the exposure interruption periods are provided during one shot exposure operation, by which the heat accumulated in the mask or the wafer is emitted, and the exposure is resumed after the heat emission, thus improving the pattern transferring precision from the wafer to the pattern.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIG. 4 is a flow chart showing a further operation of the apparatus of FIG. 1.

FIG. 5 is a sectional view illustrating another X-ray exposure apparatus for performing an exposure method according to a further embodiment of the present invention.

FIGS. 6A and 6B are graphs of changes of temperatures of the mask and/or wafer with time.

DETAILED DESCRIPTION OF THE PREFERRED EMBODIMENTS

Figure 1:
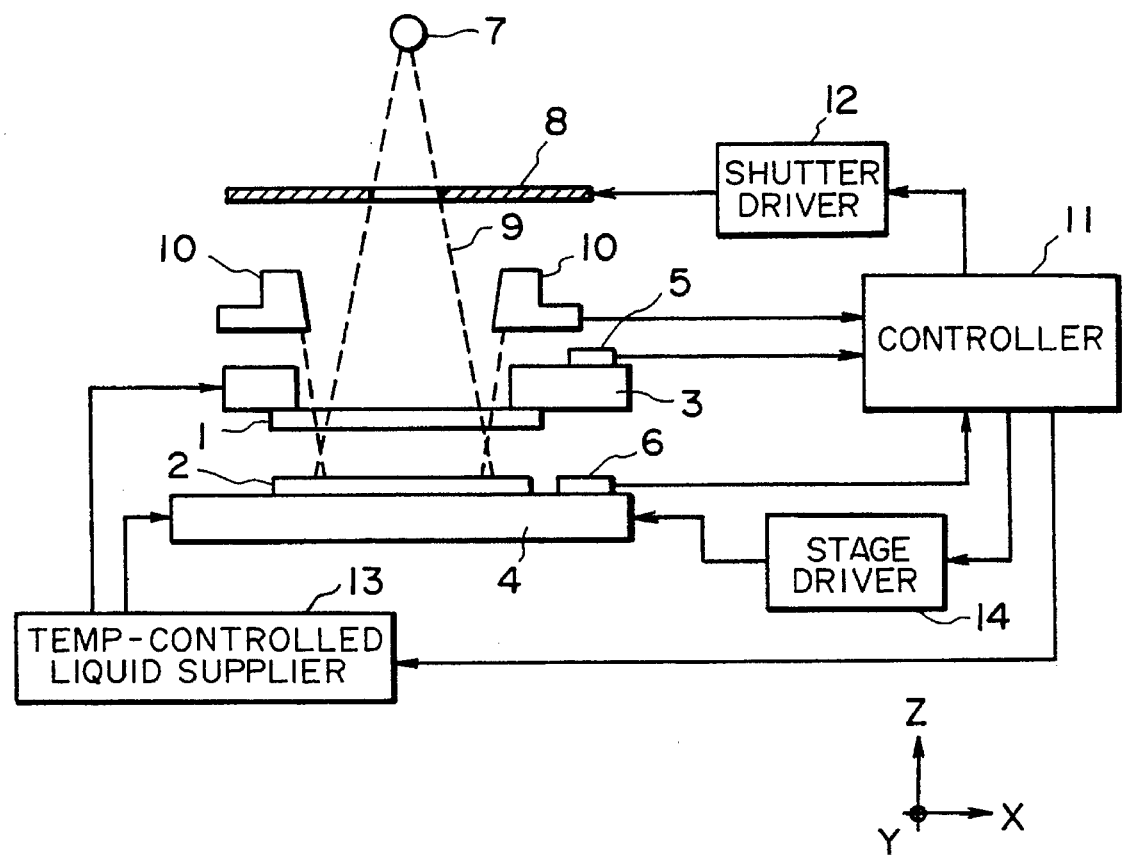
FIG. 1 is a sectional view of an X-ray exposure apparatus for performing an exposure method according to an embodiment of the present invention.

Referring to FIG. 1, there is shown an exposure apparatus for performing an exposure method according to an embodiment of the present invention. In this Figure, reference numerals 1 and 2 designate a mask having a pattern and a semiconductor wafer, respectively. The apparatus comprises a mask stage 3 for supporting the mask 1, a wafer stage 4 for supporting the wafer 2, wherein the wafer stage 4 is movable along X and Y axes to enable shot areas on the wafer 4 to be sequentially exposed to the pattern of the mask 1 in a step-and-repeat manner. Mask 1 and the wafer 2 are slightly spaced apart from each other in a direction of a Z axis which is perpendicular to the X-Y plane.

The apparatus further comprises a temperature sensor 5 fixed on the mask stage 3 to detect the temperature of the mask (mask stage), a temperature sensor 6 fixed on the wafer stage to detect the temperature of the wafer (wafer stage); exposure radiation energy 7 is applied on the wafer 2 through the mask 1 to print the pattern of the mask 1 onto the wafer 2. The exposure energy is, for example, far ultraviolet rays produced by an excimer laser or X-rays produced from a synchrotron orbital radiation ring. The exposure energy is supplied from the exposure energy source 7. The apparatus further comprises a shutter 8 for blocking the exposure energy, which will hereinafter be simply called "X-ray", supplied from the radiation source 7 so that the energy is not applied onto the mask 1 or to the wafer 2. In the Figure, the shutter 8 takes such a position as to allow passing of the exposure energy.

An alignment error detector 10 photo-electrically detects alignment marks (not shown) of the mask 1 and the wafer 2 to determine the positional deviation therebetween in the X-Y plane. The apparatus further comprises a controller 11 for controlling the entire apparatus, a shutter driver 12 for driving the shutter 8, a temperature-controlled liquid supplying device 13 capable of supplying liquid, for example, water, which is controlled to a predetermined temperature, at a desired rate to the mask stage 3 and/or the wafer stage 4 to remove heat from the mask stage 3 and/or the wafer stage 4, and a stage driver for moving the wafer stage 4 in the X-Y plane. The shutter driver 12, the liquid supplying device 13 and the stage driver 14 are operated in response to instructions by the controller 11. The controller 11 is supplied with outputs from the temperature sensors 5 and 6 and the alignment error detector 12.

Figure 2:
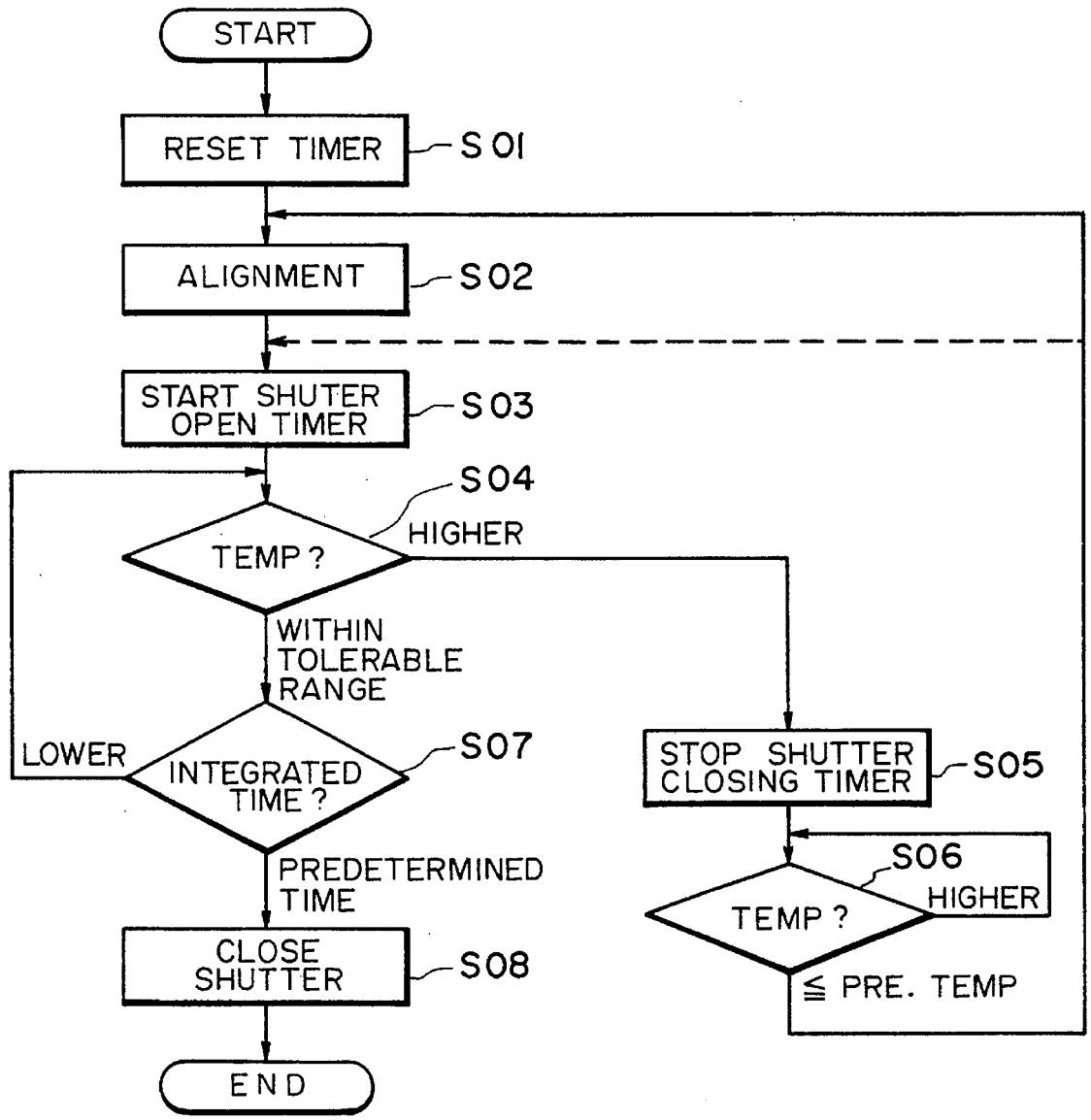
FIG. 2 is a flow chart showing an operation of the apparatus of FIG. 1.
Figure 3:
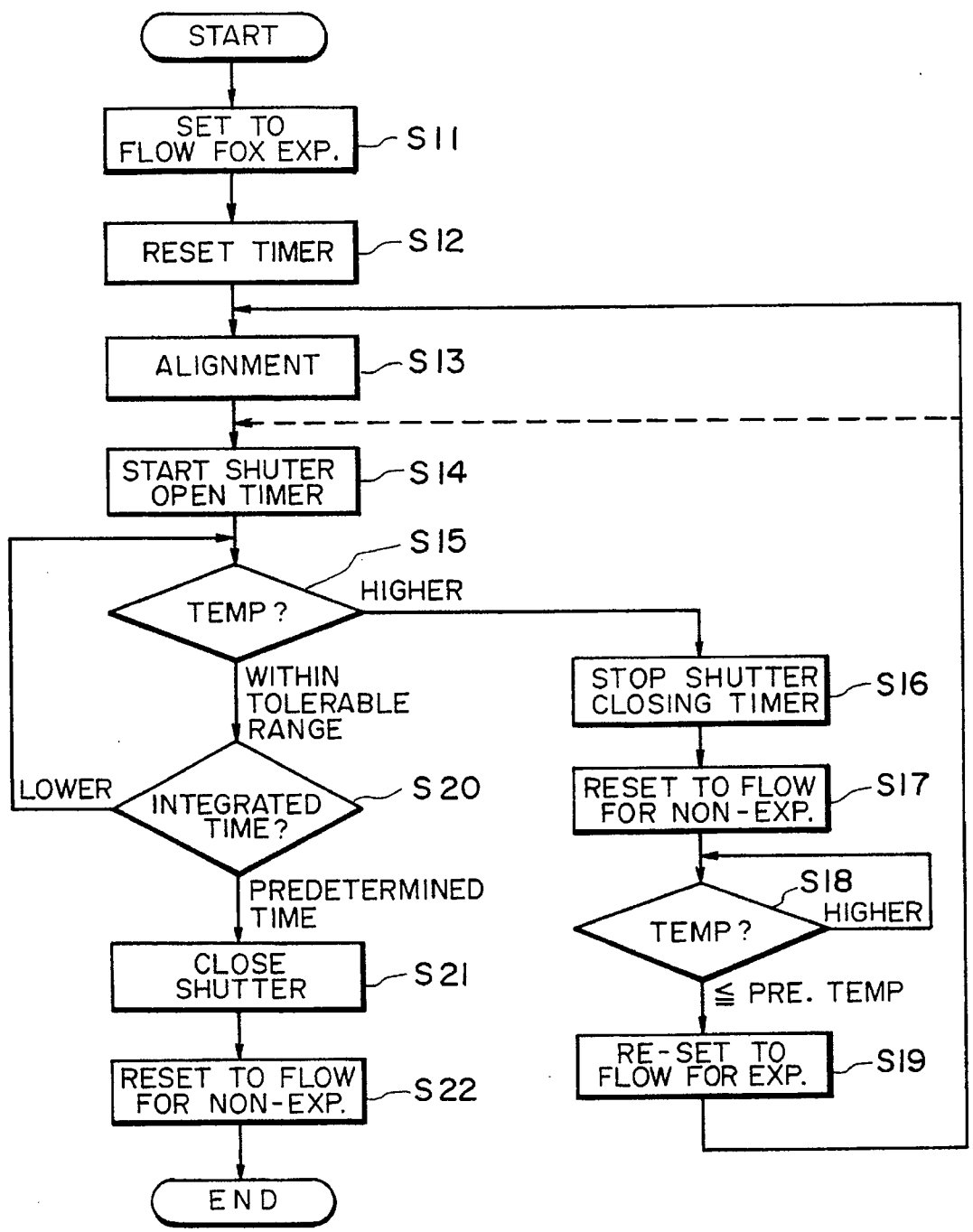
FIG. 3 is a flow chart showing another operation of the apparatus of FIG. 1.

As shown in FIGS. 2, 3 and 4, the apparatus has three modes in which it is operable, any one of the modes is selectable by an operator on an unshown key board. The operation will be described for the respective Figures.

Referring first to FIG. 2, the liquid supplying device 13 supplies liquid to the mask stage 3 and the wafer stage 4 both during the exposure operation period and during the non-exposure-operation period at such a rate that the vibration of the mask stage 3 and/or the wafer stage 4 resulting from the supply of the liquid to the mask stage 3 and/or the wafer stage 4 does not influence the pattern exposure accuracy. In this example, the mask 1 is supported on the mask stage 3, and the wafer 2 is supported on the wafer stage 4, and thereafter, the one shot area of the wafer 4 is exposed in accordance with the flow chart of FIG. 2. At step S01, a timer for measuring the cumulative time period of the exposure is reset, and at step S02 the alignment error between the mask 1 and the wafer 2 is detected by the alignment error detector 10. Then, the stage driver 14 moves the wafer stage 4 to correct the alignment error, thus correctly aligning the mask 1 and the wafer 2. Then, at step S03, the shutter 8 is opened by the shutter driver 12, by which the exposure of the wafer 2 through the mask 1 to the X-rays from the radiation source 7 is started, and simultaneously, the timer starts the time counting operation simultaneously with the exposure start.

Figure 6A shows the temperature changes of the mask 1 or the wafer 2 during the exposure operation with time. In view of this, at step S04 of FIG. 2, the temperatures of the mask 1 and the wafer 2 are monitored by the temperature sensors 5 and 6 mounted on the mask stage 3 and the wafer stage 4, respectively, and the control is effected to prevent the temperature of the mask 1 and the wafer 2 from exceeding the exposable temperature range, as shown in FIG. 6B. More particularly, at step S04, a determination is made as to whether or not the temperature of the mask 1 or the wafer 2 is within the exposable temperature range. If not, a step S05 is executed in which the shutter 8 is closed using the shutter driver 12 to interrupt the exposure operation, and simultaneously, the timer is also interrupted. By this, the exposure operation is interrupted as shown in FIG. 6B. During this period, the heat accumulated in the mask 1 (mask stage 3) and the wafer 2 (wafer stage 4) is absorbed by the liquid supplied from the temperature-controlled liquid supplying device 13, whereby the temperatures are reduced.

When the temperatures monitored by the temperature sensors 5 and 6 decrease to a sufficient degree (step S06), or when the temperatures are going to saturate, the operation goes back to the step S02 or to the step S03. During the exposure operation, the temperatures are monitored at step S04, and also, the cumulative exposure period is monitored using the timer. The above operations are repeated until the cumulative exposure period reaches the time required for providing the necessary amount of exposure for one shot. Then, the shutter S8 is closed at step S08, and the exposure operation for the one shot is completed.

Referring back to the step S06, if the temperature is lower than a predetermined temperature, and thereafter, the operation goes back to the step S02, the alignment between the mask 1 and the wafer 2 is repeated. In other words, in this case, the alignment operation is executed for each of the resumptions of the exposures after the rest period shown in FIG. 6B. It is particularly effective when the alignment error is fairly likely to occur between the mask 1 and the wafer 2 during the rest period. If this is not the case, the sequential operation returns from the step S06 to the step S03, as shown by chain lines in FIG. 2. In this case, the alignment operation between the mask 1 and the wafer 2 is performed only once before the first exposure operation.

Referring to FIG. 3, the operation of this flow chart is different from that of FIG. 2, in that the rate of the liquid supplied from the temperature-controlled liquid supplying device 13 to the mask stage 3 and the wafer stage 4 is different during the exposure operation than during the rest period (non-exposure-operation). More particularly, the rate of the liquid supplied to the mask stage and the wafer stage 4 during the exposure operation is so determined that the vibration produced by the liquid supply to the mask stage 3 and the wafer stage 4 does not influence the pattern transferring accuracy, whereas during the rest period, the rate of the flow is increased to promote the heat emission from the mask 1 (mask stage 3) and the wafer 2 (wafer stage 4). According to this embodiment, the time period required until the temperature is equal to or less than the predetermined temperature at step S18 (FIG. 3) is reduced, as compared with the example of FIG. 2.

In the present example, at step S11, the rate of the liquid flow supplied from the temperature-controlled liquid supplying device 13 to the mask stage 3 and the wafer stage 4 is set to the level for the exposure operation, and thereafter, similar to FIG. 2, the timer resetting operation at step S12, alignment operation at step S13, the opening of the shutter 8 at the step S14 and the start of the timer are executed, thus starting the operation of the wafer 2 through the mask 1 with the X-rays 9 from the radiation source 7.

During the exposure, at step S15, the temperature sensors 5 and 6 check whether the temperatures of the mask 1 (mask stage 3) and the wafer 3 (wafer stage 4) are within the temperature range determined for not influencing the pattern transferring accuracy, and at step S20, the discrimination is made as to whether or not the cumulative time of the timer reaches the predetermined exposure time. If the discrimination at step S15 is negative, that is, the temperature is beyond the tolerable range at step S15 before the discrimination at step S20 becomes affirmative, that is, before the required exposure period is reached, the operation goes to the step S16 where the shutter 8 is closed by the shutter driver 12, and simultaneously, the timer is deactivated. Then, the rate of the liquid supplied to the mask stage 3 and the wafer stage 4 is increased at step S17 to the level predetermined for the rest period, by which the heat accumulated in the mask 1 (mask stage 3) and the wafer 2 (wafer stage 4) by the application of the X-rays 9 is quickly taken off. In other words, the heat removing speed is increased.

With this stage, at step S18, the temperatures of the mask 1 (mask stage 3) and the wafer 2 (wafer stage 4) are monitored by the temperature sensors 5 and 6. When the temperatures are back in the temperature range set at step S15, the step S19 is executed, by which the flow rate of the liquid supplied from the temperature-controlled liquid supplying device 13 to the mask stage 3 and the wafer stage 4 is reduced down to the level for the exposure operation. Then, the operation returns to step S13 or to step S14. Whether to return to the step S13 or to the step S14 is selected beforehand by the operator, in consideration of the fact described in conjunction with the foregoing example.

During the repetition of the above-described operation, if the cumulative period measured by the timer reaches a predetermined period at step S20, the shutter driver 12 closes the shutter 8 at step S21, by which the exposure operation for the shot is completed. Thereafter, at step S22, the flow rate of the liquid supplied to the mask stage 3 and the wafer stage 4 is increased to the level for the rest period.

Referring to FIG. 4, another example of operation is shown. This example is different from the FIG. 2 example in that an alignment step (S36) in consideration of the temperature change is inserted between the step S35 which is the same as the step S05 of FIG. 2 and a step S37 which is the same as the step S06 of FIG. 2. At the step S37, the alignment error detector 37 detects the alignment error between the mask 1 and the wafer 2, and the temperature sensors 5 and 6 detect the temperatures of the mask 1 (mask stage 3) and the wafer 2 (wafer stage 4). The difference in the temperature between the detected temperatures and the predetermined temperatures (step S37), and the detected alignment error is corrected in consideration of the thermal deformations of the mask 1 and the wafer 2 resulting from the temperature differences. The wafer stage 4 is driven by the stage driver 14 by the amount of the corrected error. Thus, when the temperature is the predetermined temperature at step S37, the mask 1 and the wafer 2 are aligned in the predetermined relation. In this example, the exposure operation is interrupted at step S35, and when the heat is removed from the mask 1 (mask stage 3) and from the wafer 2 (wafer stage 4). by the liquid supplied from the temperature-controlled liquid supplying device 13, the alignment operation is effected in parallel. Therefore, the alignment operation between the mask 1 and the wafer 2 can be completed before the temperature is determined within the predetermined range at step S37. Therefore, the exposure rest period can be reduced as compared with the FIG. 2 example wherein the alignment operation is started after the temperature below the predetermined temperature is discriminated at step S06.

In the present example, the steps S31 through S34 and S38 to S39 are the same as the steps S01 through S04 and S07-S08 respectively of FIG. 2, and therefore, detailed description thereof is omitted for simplicity.

In the operations described above, the number of exposures for one shot is different depending on the temperature rise. One exposure may be enough in one case, plurality of exposures may be required in another. When the operations are incorporated in an exposure apparatus of a step-and-repeat type apparatus, the number of exposures is different for individual shots in one wafer.

FIG. 5 shows an X-ray exposure apparatus according to an embodiment of the present invention. In this apparatus, in place of the temperature sensors 5 and 6, an alignment error detector 10 for alignment between the mask 1 and the wafer 2 is used. The exposure sequential operation is similar to that shown in FIG. 2, for example. However, the temperature detecting method is different.

More particularly, in the apparatus of Figure 5, during the exposure operation, the alignment error detecting device 10 detects the deviation between the mask 1 and the wafer 2 using an alignment beam 32, and the temperature change is detected using the deviation. If the deviation beyond a predetermined amount occurs, it is deemed that a temperature rise occurs. In response to it, the shutter driver 12 closes the shutter 8 to interrupt the exposure operation. The exposure operation is resumed after the temperature decrease is detected using the deviation detection, again.

Alternatively, there is a method wherein the temperature is not monitored during the exposure. Instead, a set of one exposure period and one rest period is determined beforehand on the basis of the relation between the exposure period and the temperature change and the relation between the rest period and the temperature change. During the exposure operation, the shutter 8 is opened and closed at proper intervals controlled by a timer. In this method, the number of exposures for one shot is constant if the intensity of the radiation, that is, the quantity of radiation per unit time is constant and if the amount of exposure per one shot is constant.

The rest of the exposure can be provided, not by using the shutter, but by turning on and off the radiation source itself.

As described in the foregoing, according to the present invention, the X-ray exposure operations for a long period of time are possible while keeping the temperatures of the mask and the wafer within a proper temperature range. Thus, fine and very accurate pattern transfer is realized while effectively using the advantage of the short wavelength of the X-rays. In addition, the exposure for a long period of time with high precision is made possible, so that the choice of the material of the photoresist is larger.

While the invention has been described with reference to the structures disclosed herein, it is not confined to the details set forth and this application is intended to cover such modifications or changes as may come within the purposes of the improvements or the scope of the following claims.

What is claimed is:

1. An exposure method wherein a mask pattern is projected sequentially onto a plurality of shot areas of a wafer by irradiating the mask pattern with exposure energy including at least one of ultraviolet rays and X-rays, said method comprising the steps of:

(a) detecting a state of alignment between the mask and the wafer;

(b) obtaining information relating to heat accumulation of at least one of the mask and the wafer caused by the exposure energy irradiation, based on the detection of the state of alignment;

(c) discriminating whether exposure to the exposure energy irradiation is permissible on the basis of the information obtained in step (b) and on a tolerance predetermined in accordance with characteristics of at least one of the mask and wafer being used;

(d) controlling, on the basis of the discrimination in step (c), a timing at which the exposure is started and a timing at which the exposure is interrupted;

(e) obtaining an integrated amount of exposure of the shot area being exposed;

(f) when the integrated amount obtained in step (e) is lower than a predetermined level, repeating the exposure until the predetermined level is reached; and (g) executing steps (b)–(f) for the plurality of shot areas.

2. A method according to claim 1, further comprising performing an alignment operation during a timing at which the exposure is interrupted.

3. A method according to claim 1, further comprising selectively executing (i) an increase in cooling power to cool at least one of the mask and wafer and (ii) an alignment operation to align the mask and the wafer, during a timing at which the exposure is interrupted.

4. A method according to claim 1, further comprising detecting, by a temperature sensor, temperature adjacent to at least one of the mask and the wafer.

5. A method according to claim 4, further comprising removing deviation between the mask and the wafer in accordance with an output of the temperature sensor.

6. A method according to claim 1, further comprising a step of cooling at least one of the mask and the wafer.

7. A method according to claim 6, wherein said cooling step comprises causing a cooling power to be different depending on whether or not the exposure energy is being irradiated.

8. A method according to claim 7, wherein the cooling power is higher when the exposure energy is not being irradiated.

9. A step and repeat type exposure method wherein a mask pattern is projected sequentially onto a plurality of shot areas of a wafer by irradiating the mask pattern with exposure energy including at least one of ultraviolet rays and X-rays, said method comprising the steps of:

(a) obtaining information relating to heat accumulation of at least one of the mask and the wafer caused by the exposure energy irradiation, based on an output of an alignment detector that detects a state of alignment between the mask and the wafer;

(b) discriminating whether exposure to the exposure energy irradiation is permissible on the basis of the information obtained in step (a) and on a tolerance predetermined in accordance with characteristics of at least one of the mask and wafer being used;

(c) controlling, on the basis of the discrimination in step (b), a timing at which the exposure is started and a timing at which the exposure is interrupted;

(d) obtaining an integrated amount of exposure of the shot area being exposed;

(e) when the integrated amount obtained in step (d) is lower than a predetermined level, repeating the exposure until the predetermined level is reached; and (f) executing steps (a)–(e) for the plurality of shot areas.

10. A method according to claim 9, further comprising performing an alignment operation during a timing at which the exposure is interrupted.

11. A method according to claim 9, further comprising removing deviation between the mask and the wafer in accordance with an output of a temperature sensor.

12. A method according to claim 9, further comprising selectively executing (i) an increase in cooling power to cool at least one of the mask and wafer and (ii) an alignment operation to align the mask and the wafer, during a timing at which the exposure is interrupted.

13. A method according to claim 9, further comprising a step of cooling at least one of the mask and the wafer.

14. A method according to claim 13, wherein said cooling step comprises causing a cooling power to be different depending on whether or not the exposure energy is being irradiated.

15. method according to claim 14, wherein the cooling power is higher when the exposure energy is not being irradiated.

* * * * *

UNITED STATES PATENT AND TRADEMARK OFFICE
CERTIFICATE OF CORRECTION

PATENT NO.  : 5,610,965

DATED       : March 11, 1997

INVENTOR(S) : MAKIKO MORI, ET AL.

It is certified that error appears in the above-indentified patent and that said Letters Patent is hereby corrected as shown below:

ON THE COVER PAGE:

At [63] Related "U.S. Application Data"

"Mar. 2, 1991," should read --Mar. 27, 1991,--.

At [30] "Foreign Application Priority Data"

"63-22738" should read --63-227387--.

IN THE DRAWINGS:

Sheet 2

FIG. 2, in step "S03", "SHUTER" should read --SHUTTER--.

Sheet 3

FIG. 3, in step "S11", "FOX" should read --FOR--; and in step "S14", "SHUTER" should read --SHUTTER--.

Sheet 4

FIG. 4, in step "S33", "SHUTER" should read --SHUTTER--.

UNITED STATES PATENT AND TRADEMARK OFFICE
CERTIFICATE OF CORRECTION

PATENT NO. : 5,610,965

DATED : March 11, 1997

INVENTOR(S) : MAKIKO MORI, ET AL.

It is certified that error appears in the above-indentified patent and that said Letters Patent is hereby corrected as shown below:

Column 1

Line 15, "semiconductor" should read --semiconductor manufacturing--.

Line 16, "device" should read --device and more--.

Line 26, "linewidth" should read --line width--.

Column 4

Line 29, "wafer 3" should read --wafer 2--.

Line 31, "the" should be deleted.

Column 5

Line 24, "determined" should read --determined to be--.

Line 32, "S07-S08" should read --S07 to S08,--.

Line 36, "plurality" should read --a plurality--.

UNITED STATES PATENT AND TRADEMARK OFFICE
CERTIFICATE OF CORRECTION

PATENT NO. : 5,610,965

DATED : March 11, 1997

INVENTOR(S) : MAKIKO MORI, ET AL.

It is certified that error appears in the above-indentified patent and that said Letters Patent is hereby corrected as shown below:

Column 7

Line 25, the left margin should be closed up.

Column 8

Line 23, "method" should read --a method--.

Signed and Sealed this

Tenth Day of February, 1998

Attest:

BRUCE LEHMAN

Attesting Officer

Commissioner of Patents and Trademarks